United States Patent

[11] 3,569,798

[72] Inventors Robert Amantea
Princeton;
Hans Werner Becke, Morristown; Paul
Joseph Del Priore, Raritan, N.J.

[21] Appl. No. 824,225
[22] Filed May 13, 1969
[45] Patented Mar. 9, 1971
[73] Assignee RCA Corporation

[54] DOUBLE HEAT SINK SEMICONDUCTOR DEVICE
7 Claims, 2 Drawing Figs.

[52] U.S. Cl. .......... 317/234, 317/242
[51] Int. Cl. .......... H01l 1/12
[50] Field of Search .......... 317/234, 235, 237—241

[56] References Cited

UNITED STATES PATENTS

| | | | |
|---|---|---|---|
| 2,648,805 | 8/1953 | Spenke et al. | 317/235 |
| 2,959,718 | 11/1960 | Kadelburg et al. | 317/234 |
| 2,999,964 | 9/1961 | Glickman | 317/234 |
| 3,002,271 | 10/1961 | Thornton | 29/488 |
| 3,041,510 | 6/1962 | Hower et al. | 317/235 |
| 3,271,625 | 9/1966 | Caracciolo | 317/101 |
| 3,413,532 | 11/1968 | Boyer | 317/235 |
| 3,447,042 | 5/1969 | Andersson | 317/234 |

*Primary Examiner*—James D. Kallam
*Attorney*—Glenn H. Bruestle

ABSTRACT: A semiconductor device comprising a pair of flat metal disks arranged in overlapping, spaced relation. A semiconductor element having a contact at each end thereof and a third contact between its ends is mounted between the disks with one of the end contacts being electrically and thermally connected to one of the disks. A metal plug extends through an opening in the other disk and is electrically and thermally connected to the other end contact of the semiconductor element. A thin metal contact plate is mounted between the disks and projects beyond the edges of the disk. The contact plate engages the third contact of the semiconductor element. A pair of annular washers of an electrical insulating material are mounted between the metal disks with each washer being between the contact plate and a separate one of the metal disks. The washers are secured to the contact plate and the metal disks to secure the assembly together.

PATENTED MAR 9 1971 3,569,798

INVENTORS
Robert Amantea and
Hans Werner Becke
Paul Joseph Del Priore

BY [signature]
ATTORNEY

DOUBLE HEAT SINK SEMICONDUCTOR DEVICE

BACKGROUND OF THE INVENTION

The invention herein disclosed was made in the course of or under a contract or subcontract thereunder with the Department of the Air Force.

The present invention relates to a double heat sink semiconductor device particularly for a high-power, high frequency semiconductor element.

Semiconductor devices when used in an electrical circuit generally generate heat which, if it becomes excessive, can adversely effect the operation of the semiconductor device. Where the heat generated in the semiconductor element may become excessive, it is the practice to mount the semiconductor element on a heat sink which conducts the heat from the semiconductor element and dissipates the heat to the atmosphere. High-power semiconductor devices, which generate a large amount of heat, require either a large heat sink or special means for dissipating the heat, such as cooling fins. However, such heat-dissipating means have the disadvantage that they increase the overall size of the semiconductor assembly as well as the cost of the assembly.

SUMMARY OF THE INVENTION

A semiconductor device comprising a pair of metal bodies having flat surfaces in spaced, parallel relation. A semiconductor element having a contact at each end and a third contact between its ends is mounted between the metal bodies with each of the end contacts being electrically and thermally connected to a separate one of the metal bodies. A metal contact plate is between the flat surfaces of the metal bodies and projects beyond the edge of the metal bodies. The contact plate has a hole therethrough through which the semiconductor element extends and the edge of the hole engages the third contact of the semiconductor element. A pair of bodies of electrical insulating material are between and secured to the flat surfaces of the metal bodies and the contact plate. The bodies of electrical insulating material seal the space between the metal bodies.

DETAILED DESCRIPTION

Figure 2:
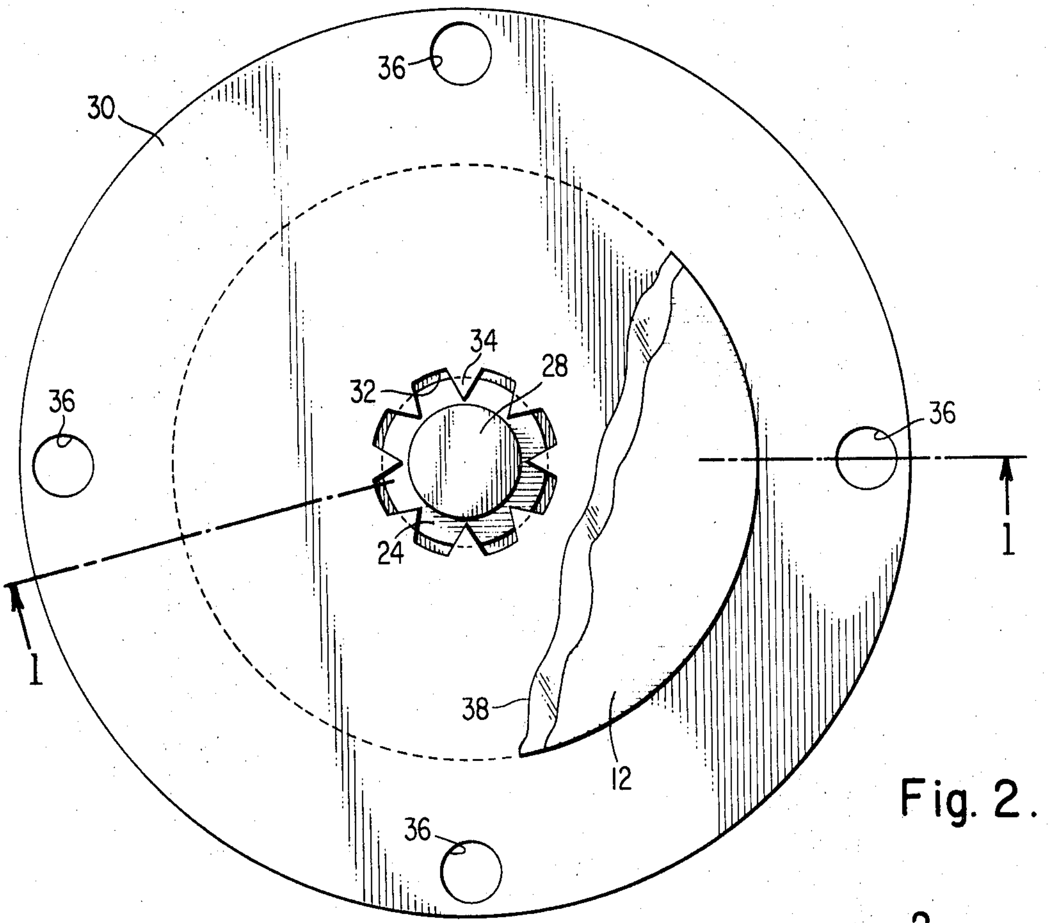
FIG. 2 is a sectional view of the semiconductor device taken along line 2–2 of FIG. 1.
Figure 1:
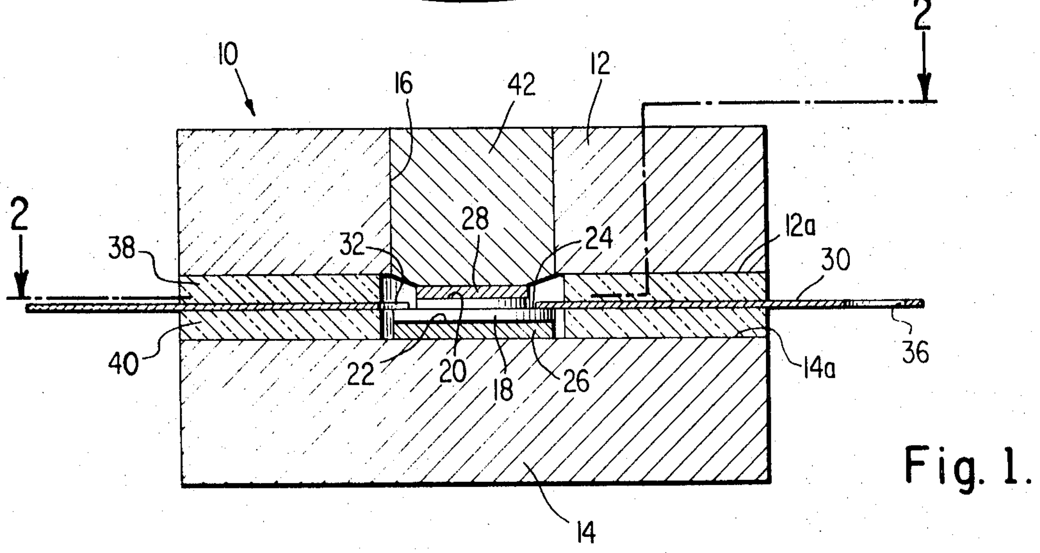
FIG. 1 is a transverse sectional view of a preferred embodiment of the semiconductor device of the present invention.

Referring to the drawings, an embodiment of the semiconductor device of the present invention is generally designated as 10. Semiconductor device 10 comprises a pair of metal discs 12 and 14 having opposed flat surfaces **12*a* and 14*a* respectively in overlapping, closely spaced, parallel relation. The discs 12 and 14 are of a good electrically and thermally conductive metal, such as copper. Although the size of the discs 12 and 14 may vary depending on the amount of heat to be dissipated, the discs can be as small as one-half inch in diameter and 0.100 inch in thickness. The disc 12 has a central hole 16** therethrough.

A semiconductor element 18, which may be a high-power, high frequency transistor, is mounted between the flat surfaces **12*a* and 14*a* of the discs 12 and 14 at the center of the discs The semiconductor element 18 is of a crystalline semiconductor material, such as silicon, having P-type and N-type regions therein which provide PN junctions therebetween. Contacts 20 and 22 are provided on the end surfaces of the semiconductor element 18, and a third contact 24 is provided on an annular, radially extending ledge which extends around the semiconductor element between its ends. In the embodiment shown, the contacts 20 and 22 are the collector and emitter respectively and the third contact 24** is the base contact for the transistor.

A metal washer 26 is provided between the emitter contact 22 of the semiconductor element 18 and the flat surface **14*a* of the disc 14, and a second metal washer 28 is provided on the collector contact 20 of the semiconductor element. The washers 26 and 28 are of a good electrically and thermally conductive metal, such as molybdenum or tungsten, to provide thermal expansion matching with the semiconductor element and reduce effects of thermal cycling. The washer 26 is secured to the emitter contact 22 and the disc 14 by a suitable solder, and the washer 28 is similarly secured to the collector contact 28**.

A thin circular contact plate 30 of an electrically conductive metal, such as a beryllium-copper alloy, is provided between the discs 12 and 14. Contact plate 30 is approximately 2mils thick and is of a diameter larger than the diameter of the discs 12 and 14 so that the contact plate projects radially beyond the edges of the discs. The contact plate 30 has a central hole 32 therethrough through which the semiconductor element 18 extends. As shown in FIG. 2, a plurality of circumferentially spaced contact fingers 34 project radially inwardly from the edge of the hole 32. The fingers 34 engage the base contact 24 of the semiconductor element 18 so that the contact plate is electrically connected to the base contact 24. A plurality of circumferentially spaced small holes 36 are provided in the contact plate 30 adjacent the edge of the contact plate and beyond the edges of the discs 12 and 14. The holes 36 provide for ease of making electrical connecting to the contact plate.

A pair of annular washer 38 and 40 of an electrically insulating material, such as beryllia or alumina, are provided between the discs 12 and 14. However, it is preferred to use beryllia washers because of the thermal conductivity properties of beryllia. The washer 38 is positioned between the flat surface **14*a* of the metal disc 12 and the contact plate 30, and the washer 40 is positioned between the flat surface 14*a* of the metal disc 14 and the contact plate 30. Washers 38 and 40 have an internal diameter larger than the diameter of the semiconductor element 18 and an outer diameter equal to the diameter of the metal discs 12 and 14. The flat surfaces of the washer 38 and 40 are coated with a thin metal film and are secured by a suitable solder to the contact plate 30 and the flat surfaces 12*a* and 14*a* of the adjacent discs 12 and 14. Thus, the washer 38 and 40 secure the discs 12 and 14 and the contact plate 30** together and seal the space between the metal discs.

A plug 42 preferably of the same metal as the metal discs 12 and 14 fits tightly within the hole 16 in the disc 12 and engages the metal washer 28. The plug 42 is soldered to the metal disc 12 and to the washer 28 so as to secure the plug to the metal disc and to provide a good electrical connection to the semiconductor element 18 through the washer 28. The solder used to secure the plug 42 to the metal disc 12 and the washer 28 preferably is of a composition which has a lower melting temperature than the solder used to secure together the other parts of the semiconductor device 10.

To assemble the semiconductor device 10, the semiconductor element 18 and the metal washers 26 and 28 are placed in stacked relation on the flat surface **14*a* of the metal disc 14. The contact plate 30 and insulating washers 38 and 40 are arranged in stacked relation on the flat surface 14*a* of the metal disc 14 with the contact finger 34 engaging the third contact 24 of the semiconductor element 18. The metal disc 12 is then placed on the insulating washer 38 and the assembly is heated to solder the parts together. The solder may be provided by precoating the surfaces of the metal washers 26 and 28 and the insulating washers 38 and 40 with a thin film of solder or by placing solder preforms between the surfaces of the parts to be soldered together. Also, the metal washers 26 and 28 may be presoldered to the semiconductor element 18 and the subassembled placed on the metal disc 14. The plug 42 is then inserted in the hole 16 in the metal disc 12 and heated to solder the plug to the metal disc 12 and the metal washer 28. By inserting the plug 42 last and using a lower melting temperature solder for securing the plug to the metal disc 12 and the metal washer 28 the thermal stresses on the semiconductor element 18** are greatly reduced.

In the semiconductor device 10, the metal discs 12 and 14 provide the emitter and collector terminals for the semiconductor element 18. In addition, the metal discs 12 and 14 provide relatively large bodies which act as heat sinks for the semiconductor element. Thus, the heat generated in the semiconductor element 18 is conducted in two directions from the semiconductor element to the metal discs 12 and 14 which dissipate the heat to the atmosphere. Therefore, the semiconductor device 10 is provided with good heat dissipation by the double heat sinks while maintaining the device small in size. Also, the semiconductor device 10 is symmetrical in shape as that it can be easily connected in an electrical circuit. In addition, the semiconductor device 10 has minimum series inductance.

We claim:

1. A semiconductor device comprising:
   a. a pair of metal bodies having flat surfaces in spaced, parallel relation;
   b. a semiconductor element between said metal bodies, said semiconductor element having a contact at each end thereof and third contact between its ends each of said end contacts being electrically and thermally connected to a separate one of said metal bodies;
   c. a metal contact plate between the flat surfaces of said metal bodies and projecting beyond the edges of said metal bodies, said contact plate having a hole therethrough through which the semiconductor element extends, the edge of said contact plate at said hole engaging the third contact of the semiconductor element; and
   d. a pair of bodies of electrical insulating material between and secured to the metal bodies and the contact plate, said bodies of electrical insulating material sealing the space between the metal bodies.

2. A semiconductor device in accordance with claim 1 in which one of said metal bodies has a hole therethrough, a metal plug is within said hole and is secured to said one metal body, and the electrical and thermal connection between said one metal body and a contact of the semiconductor element is through said plug.

3. A semiconductor device in accordance with claim 2 including a separate metal washer engaging the contact at each end of the semiconductor element, one of said washers contacting the plug and the other washer engaging the flat surface of the other metal body so as to provide the electrical and thermal connections between the contacts of the semiconductor element and the plug and other metal body.

4. A semiconductor device in accordance with claim 1 in which the semiconductor element has a ledge between its ends and the third contact is on said ledge.

5. A semiconductor device in accordance with claim 4 in which the contact plate has a plurality of fingers extending inwardly from the edge of the hole therein and the fingers engage the third contact of the semiconductor element.

6. A semiconductor device in accordance with claim 5 in which the third contact extends completely around the ledge.

7. A semiconductor device in accordance with claim 1 in which the bodies of insulating material are of beryllia.